United States Patent
Liu

(10) Patent No.: US 9,271,525 B2
(45) Date of Patent: Mar. 1, 2016

(54) ELECTRONIC CIGARETTE CASE

(75) Inventor: Qiuming Liu, Shenzhen (CN)

(73) Assignee: HUIZHOU KIMREE TECHNOLOGY CO., LTD., SHENZHEN BRANCH, Shenzhen, Guangdong Province (CN)

( * ) Notice: Subject to any disclaimer, the term of this patent is extended or adjusted under 35 U.S.C. 154(b) by 320 days.

(21) Appl. No.: 13/824,450

(22) PCT Filed: Jun. 20, 2012

(86) PCT No.: PCT/CN2012/077243
§ 371 (c)(1),
(2), (4) Date: Mar. 18, 2013

(87) PCT Pub. No.: WO2013/189050
PCT Pub. Date: Dec. 27, 2013

(65) Prior Publication Data
US 2013/0341218 A1    Dec. 26, 2013

(51) Int. Cl.
*A24F 47/00* (2006.01)
*A24F 15/00* (2006.01)
*A24F 15/18* (2006.01)

(52) U.S. Cl.
CPC ................ *A24F 15/00* (2013.01); *A24F 15/18* (2013.01); *A24F 47/008* (2013.01)

(58) Field of Classification Search
CPC .................................................. A24F 47/008

USPC ............ 131/329; 206/242–276; 320/114–115
See application file for complete search history.

(56) References Cited

U.S. PATENT DOCUMENTS

| | | | |
|---|---|---|---|
| 5,938,017 A * | 8/1999 | Wik | 206/256 |
| 2007/0127227 A1* | 6/2007 | Osawa | 362/29 |
| 2008/0142352 A1* | 6/2008 | Wright | 200/600 |
| 2008/0257367 A1* | 10/2008 | Paterno et al. | 131/328 |
| 2009/0107829 A1* | 4/2009 | Heimann | 200/600 |
| 2011/0294543 A1* | 12/2011 | Lapstun et al. | 455/556.1 |
| 2012/0227753 A1* | 9/2012 | Newton | 131/347 |

* cited by examiner

*Primary Examiner* — Richard Crispino
*Assistant Examiner* — Eric Yaary
(74) *Attorney, Agent, or Firm* — Cheng-Ju Chiang

(57) ABSTRACT

The present invention relates to an electronic cigarette case, including a case body, a frame module disposed in the case body, a battery module, and a printed circuit board (PCB) module. The electronic cigarette case further has a touch control method for performing at least a predefined function. The touch control method includes: defining a touch zone on the case body, and providing a touch control module in the case body. The at least a predefined function is performed to indicate an electric quantity of a battery when a finger touch gesture is detected on the touch zone by the touch control module. The electronic cigarette case is durable, waterproof and dustproof, rapidly response, space saving, and easy to use.

14 Claims, 5 Drawing Sheets

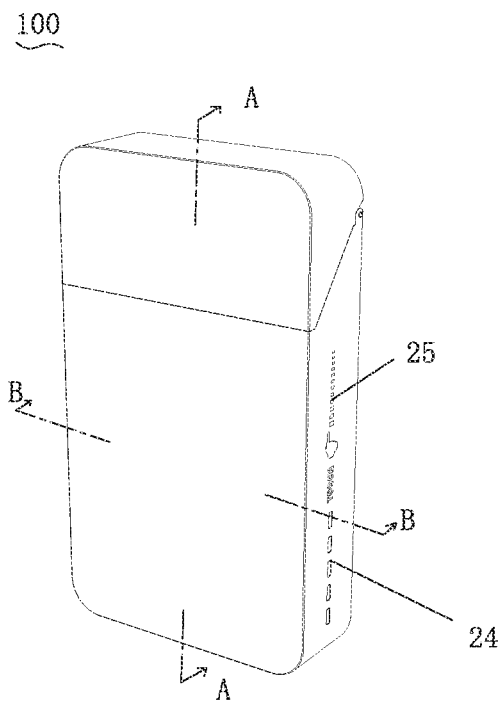
FIG. 1
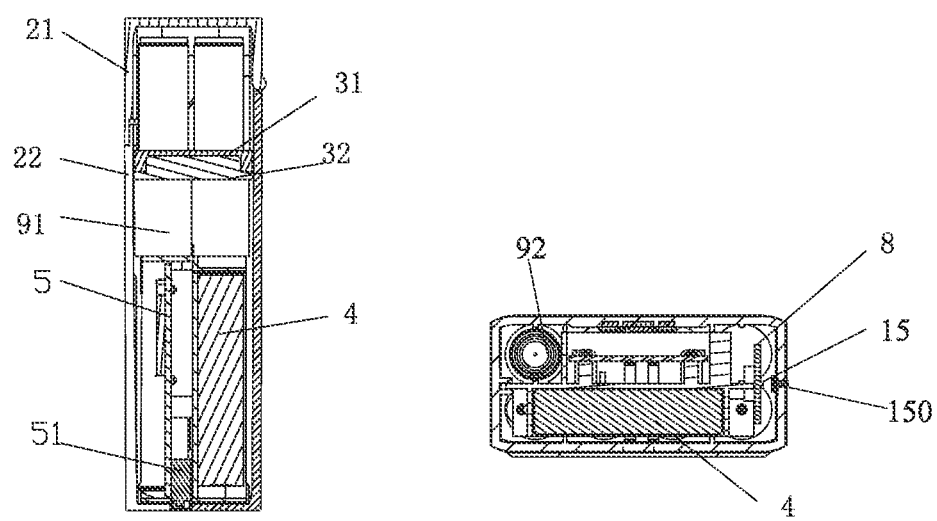
FIG. 2
FIG. 3

ELECTRONIC CIGARETTE CASE

CROSS REFERENCE TO RELATED APPLICATIONS

The present application is a 35 U.S.C. §371 National Phase conversion of International (PCT) Patent Application No. PCT/CN2012/077243, filed on Jun. 20, 2012, the disclosure of which is incorporated by reference herein. The PCT International Patent Application was filed in Chinese.

BACKGROUND OF THE INVENTION

1. Field of the Invention

The present invention relates to an electronic cigarette case.

2. Related Art

An electronic cigarette is a kind of simulating cigarette which heats and atomizes materials having flavors through a heating wire to generate smoke for use. An electronic cigarette case for accommodating at least one electronic cigarette generally includes a case body and a rechargeable battery disposed in the case body. When not smoking, the at least one electronic cigarette is put in the electronic cigarette case and recharged through a battery so as to assure that the at least one electronic cigarette has enough electric quantity for use. Therefore, users need to know a remaining electric quantity of a battery at any moment. The existing electronic cigarette case is controlled by a physical key, i.e. a mechanical key, to indicate a reaming electric quantity of the electronic cigarette case on a digital display screen. However, gaps are formed between the physical key and case body and therefore resulted in incapability of waterproof and dustproof. Besides, the physical key has a short limited lifespan. Furthermore, the physical key is easily be pressed and leads to a misoperation. Therefore, it is necessary to provide an electronic cigarette case that is capable of overcoming the above-mentioned problems.

SUMMARY OF THE INVENTION

Accordingly, an object of the present invention is to provide an electronic cigarette case which is durable, waterproof and dustproof, rapidly response, space saving, easy to use, and is aesthetic in appearance.

To achieve the above objects, the present invention provides an electronic cigarette case comprising a case body, a frame module disposed in the case body, a battery module, and a printed circuit board (PCB) module. The electronic cigarette case further comprises a touch control method for performing at least a predefined function. The touch control method comprises defining a touch zone on the case body, and providing a touch control module in the case body, and the at least a predefined function being performed when a finger touch gesture is detected on the touch zone by the touch control module.

The touch control module comprises a touch key unit. The touch key unit comprises a touch sensor element and a touch detection control circuit electrically coupled to the touch sensor element, a corresponding electrical signal generated when the finger touch gesture or a finger contact is detected on the touch zone by the touch sensor element. The electrical signal is received by the touch detection control circuit so as to perform the at least a predefined function.

The touch key unit is a resistive touch switch or a capacitive sensor switch. The touch sensor element is a touch sensor conductor for used in the capacitive sensor switch. When touching a figure onto the touch sensor conductor, capacitors of the touch sensor conductor are changed in capacitance, and therefore the touch detection control circuit is enabled to perform the at least a predefined function according to the change of the capacitors. Alternatively, the touch sensor element includes at least two disconnected resistors for used in the capacitive sensor switch, and when the resistors are electrically connected by a figure tough so as to control a circuit to be on or off. Therefore, the touch detection control circuit is capable of detecting resistance variation so as to perform the at least a predefined function.

With respect to the resistive touch switch and the capacitive sensor switch, the touch sensor element includes a set of conductors or resistors being separately disposed with each other. When the finger touch gesture is detected on the touch zone, the touch detection control circuit detects all electrodes or the resistors changed correspondingly in capacitance or resistance, whereby performing the at least a predefined function.

The case body defines a display area. The touch control module further comprises a display unit including a display control circuit and a display element connected with the display control circuit. The touch detection control circuit is intended to detect variation of the electrical signal generated when the finger touch gesture or the finger contact is detected on the touch zone by the touch sensor element. The display control unit is intended to control the display element for information display, and when variation of the corresponding electrical signal is detected, the touch detection control circuit excites the display control circuit to trigger the display element displaying predetermined information.

The touch sensor element is disposed on the touch zone or inside the case body behind the touch zone. The display unit is disposed within or behind the display area.

The at least a predefined function is to indicate a reaming electric quantity of the battery module. The touch control module further comprises a battery detection circuit for detecting the electric quantity of the battery module. The display element is intended to display the remaining electric quantity. When a finger moves on the touch zone, the touch detection control circuit is capable of detecting variation of the corresponding electrical signal and exciting the display control circuit to control the display element to display an electric quantity of the battery module detected by the battery detection circuit.

The touch detection control circuit is integrated with the PCB module. The display control circuit is integrated with the PCB module, and the battery detection circuit is integrated with the PCB module in a manner such that an electronic circuit is directly integrated in the PCB module, or through a control integrated circuit (IC) or other electronic components plugged in the PCB module.

The touch sensor element is installed with the PCB module. The display element is installed with the PCB module. The battery module is a case battery and/or an electronic cigarette battery. The battery module is electrically connected with the PCB module through a battery connector, and the PCB module is provided with a charging port for charging the battery module from an external power.

The PCB module comprises a cigarette case PCB and a touch PCB both connected through a connector.

The touch sensor element and the display element are installed on a front side of the touch PCB. The touch detection control circuit is integrated with the control IC of the touch PCB. The control IC is installed on a rear side of the touch PCB. The display control circuit is integrated in the control IC, or in another control IC on the touch PCB, or directly integrated in an electronic circuit of the touch PCB or the cigarette case PCB. The battery detection circuit is integrated in the cigarette case PCB, or in the touch PCB. The touch detection control circuit, the display control circuit, the battery detection circuit are all integrated in the control IC on the rear side of the touch PCB.

The display unit is a row of light emitting diodes (LEDs). The LEDs is intended to indicate a rate of the remaining electric quantity. Further, a light guiding plate is mounted above the LEDs, and the LEDs are disposed within or behind the display zone over the light guiding plate.

The touch zone and the display area are defined on a side wall of the case body. The touch PCB is correspondingly disposed on an inner wall of the case body. The touch sensor element and the display element are respectively located corresponding to the touch zone and the display area. The frame module comprises a tray, a cartridge holder and a bottom base. The tray and the cartridge holder cooperatively hold cartridges of electronic cigarettes therein, and the battery module and the PCB module are securely disposed in the bottom base.

The electronic cigarette case has at least the following advantages: to substitute the existing physical key control method, the electronic cigarette case comprises the touch control method defining the touch zone on an outer surface of the case body, and providing the touch control module in the case body. The appearance of the electronic cigarette is aesthetic. Comparing to the traditional physical key, the present invention is more durable, waterproof and dustproof, rapidly response, space saving, easy to use.

BRIEF DESCRIPTION OF THE DRAWINGS

FIG. 1 is a perspective view of an electronic cigarette case in accordance with an embodiment of the present invention;

FIG. 2 is a cross-sectional view taken along the line A-A in FIG. 1;

FIG. 3 is a cross-sectional view taken along the line B-B in FIG. 1;

DESCRIPTION OF THE PREFERRED EMBODIMENTS

Figure 4:
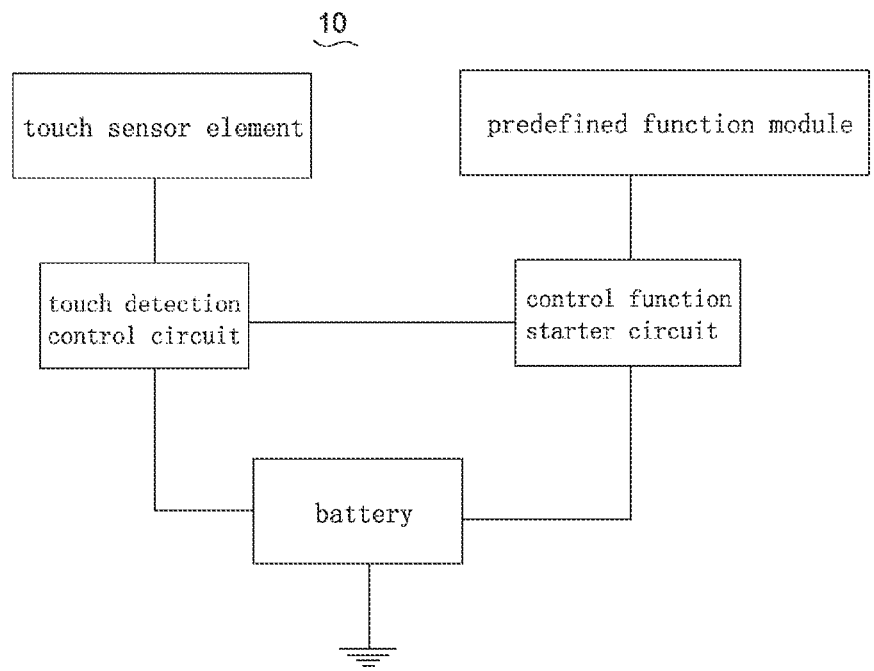
FIG. 4 is a circuit theory drawing of a touch control module of the present invention.
Figure 7:
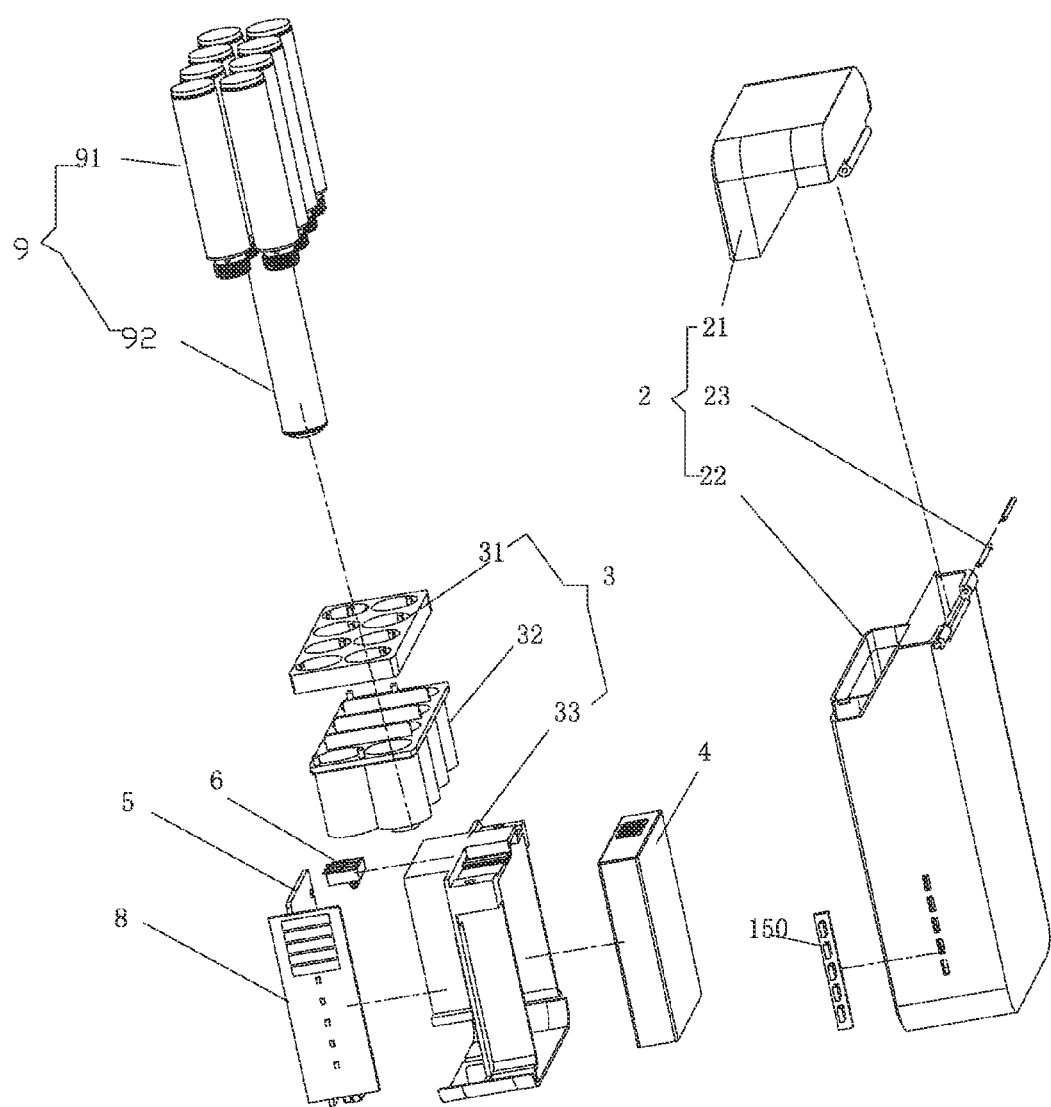
FIG. 7 is a perspective exploded view of the electronic cigarette case in accordance with an embodiment of the present invention.
Figure 8:
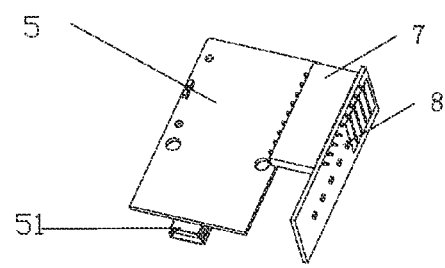
FIG. 8 is a perspective view showing modules of the electronic cigarette case in accordance with an embodiment of the present invention.
Figure 9:
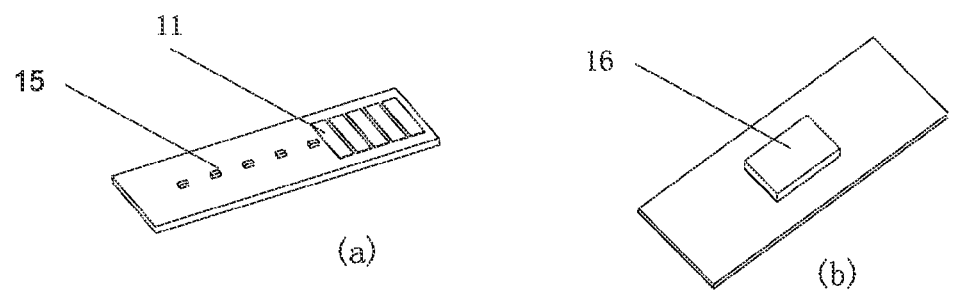
FIGS. 9(a) and 9(b) of FIG. 9 are perspective views respectively showing modules of the electronic cigarette case viewed from different angles in accordance with an embodiment of the present invention.

Referring to FIGS. 1, 4 and 7, the present invention is to proved an electronic cigarette case 100, comprising a case body 2, a frame module 3 disposed in the case body 2, a battery module (not labeled), and a printed circuit board (PCB) module (not labeled). The electronic cigarette case 100 further comprises a touch control method for performing at least a predefined function. The touch control method comprises: defining a touch zone 25 on an outer surface of the case body 2, and providing a touch control module 10 in the case body 2. When a finger touch gesture is detected on the touch zone 25 by the touch control module 10, the at least a predefined function is performed. The touch control module 10 comprises a touch key unit, which comprises a touch sensor element 11 and a touch detection control circuit 12 electrically coupled to the touch sensor element 11. A corresponding electrical signal is generated the touch sensor element 11 when the finger touch gesture is detected on the touch zone 25 by the touch sensor element 11. The touch control module 10 further comprises a predefined function unit having a control function starter circuit and a predefined function module. When variation of an electrical signal of the touch sensor element 11 is detected by the touch detection control circuit, the touch detection control circuit excites the control function starter circuit to trigger the predefined function module so as to perform the at least a predefined function. The at least a predefined function is to indicate a reaming electric quantity of the battery module. Alternatively, the predefined function is capable of including music play, video play, temperature display, or turning a radio on and off. To perform those functions, related modules of music, video, temperature, or radio are to be provided in the electronic cigarette case 100 so as to be excited and controlled by the touch control module 10. The battery module is a case battery and/or a cigarette rod battery. The PCB module is a cigarette case PCB, which is integrated with all electric circuit-related or function-related modules. The PCB module further includes a touch PCB being individually provided for realizing the at least a predefined function through a touch control method, whereby the touch control module 10 is capable of being integrated with the touch PCB so as to realize other predefined functions. A method to integrate the cigarette case PCB or the touch PCB is to design an electric circuit directly with electronic circuits of a PCB, or to be inserted to the PCB through a control IC or other electronic components. An embodiment of indicating a rate of a remaining electric quantity of the case battery in a way of touch control is provided below to describe how the present invention is to perform the predefined function through the touch control method. By making reasonable inferences from the embodiment of the present invention, one of an ordinary skill in the art is able to perform other predefined functions through the touch control method.

Referring to FIGS. 1-9, in this embodiment, the battery module is a case battery 4. The PCB module comprises a cigarette case PCB 5 and a touch PCB 8. The case battery 4 is electrically connected with the cigarette case PCB 5 through a battery connector 6. An electronic cigarette 9 is stored in the electronic cigarette case 100 and capable of being charged therein. The electronic cigarette 9 has a cartridge 91 and a battery rod 92. The cartridge 91 includes cigarette mediums and an atomizer (not shown) for atomizing the cigarette mediums to be smoke for use. Generally, as shown in FIG. 7, the electronic cigarette case is capable of storing a plurality of the cartridges 91 and one to two of the battery rods 92.

The case body 2 comprises a case cover 21, a bottom base 22, and a rotation shaft for pivotally connects the case cover 21 to the bottom base 22. The case body 2 is defined with a touch zone 25 for a finger moving thereon and a display area 24 for displaying the predefined function. The touch zone 25 is generally a portion of an outer surface of the case body 2, and is provided with a mark for the purpose of recognition by users. The display area 24 is exemplified by at least an opening, a transparent display window, or a liquid crystal display (LCD) screen based on the need of practical application. In this embodiment, the display area 24 is a row of openings.

The frame module 3 comprises a tray 31, a cartridge holder 32, and a bottom base 33. The tray 31 is plate-like and made of silica gel material to fix and protect the cartridges 91. Multiple through holes (not labeled) are provided in the tray 31 and match with the cartridges 91. The shape of the through holes are circle but not limited thereby. The cartridge holder 32 comprises multiple parallel cylinders (not labeled) which connect to each other in parallel. Inner chambers of the cylinders are configured to correspond to the through holes of the tray 31. The tray 31 is mounted onto the cartridge holder 32 and functions in cooperation with the cartridge holder 32 to hold and accommodate partial portions of cartridges 91 of the electronic cigarettes 9. The shape and height of the tray 31 and the cartridge holder 32 correspond to the cartridges 91 and also match with the shape of the case body 2. Generally, the cartridges 91 are cylindrical, and the case body 2 is a rectangle. Correspondingly, in this embodiment the tray 31 is rectangular, and the cartridge holder 32 is rectangular, but the shape of both can be varied according to actual needs. The plurality of cartridges 91 are respectively inserted into the cylinders of the cartridge holder 32 from the circular through holes of the tray 31 so as to be accommodated in case cover 21 and a corresponding inner space of the top of bottom base 22. The bottom base 33 is located under the cartridge holder 32 in the bottom base 22. The case battery 4 and the cigarette case PCB 5 are respectively held by the bottom base 33, and the case battery 4 is electrically connected to the PCB 5 through the battery connector 6. The bottom base 33 defines an accommodating space (not labeled). When the electronic cigarettes 9 are stored in the electronic cigarette case 100, the battery rods 92 are inserted in the accommodating space of the bottom base 33. The battery rods 92 are electrically connected with the cigarette case PCB 5 for being charged by the case battery 4.

The cigarette case PCB 5 is provided with a charging port 51 thereon, for example, such us a universal serial bus (USB) port, for charging the case battery 4 from an external power.

The present invention is to utilize a finger touching and moving on the touch zone 25 to trigger the touch control module 10 to display predefined information over the display area 24. The touch control module 10 comprises the touch key unit and a display unit, wherein the display unit is equal to the predefined function unit. The touch key unit comprises the touch sensor element 11 and the touch detection control circuit 12. The display unit includes a display control circuit 14 and a display element 15, wherein the display control circuit 14 is the control function starter circuit, and the display element 15 is the predefined function module. The touch detection control circuit 12 is intended to detect variation of the electrical signal of the touch sensor element 11 when the finger moves on the touch zone 25. The variation of the electrical signal is capable of being defined as variation of capacitors, resistors, electric currents or voltages. The display control circuit 14 is intended to control the display element 15 so as to display information. When variation of the corresponding electrical signal is detected, the touch detection control circuit excites the display control circuit 14 to trigger the display element 15 displaying the predefined information. The present invention is to utilize a finger touching and moving on the touch zone 25 of the case body 2 to indicate a remaining electric quantity of the case battery 4. Certainly, the present invention is capable of being used to control the display of other information, for example, such as play songs from a multimedia player, or play video, or to function as a radio module.

Figure 5:
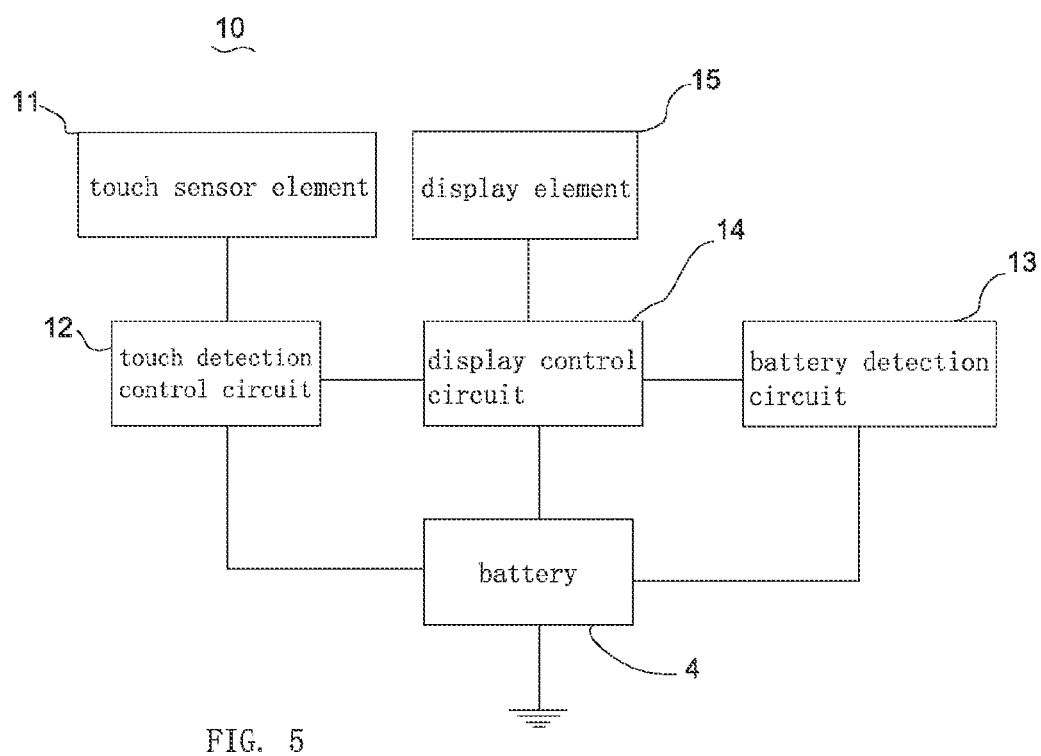
FIG. 5 is a circuit theory drawing of a touch control in accordance with an embodiment of the present invention.

Referring to FIG. 5 showing a touch control circuit theory, the touch control module 10 of the present invention is capable of exciting through a touch switch. Therefore, the touch control module 10 further comprises a battery detection circuit 13 for detecting an electric quantity of the case battery 4, wherein the touch detection control circuit 12 is intended to detect the electrical signal of the touch sensor element 11 generated in response to the finger touch gesture. The battery detection circuit 13 is intended to detect an electric quantity of a battery. The display control circuit 14 is intended to control the display element 15 for information display. The display element 15 is intended to display the electric quantity, and includes a screen or a row of light emitting diodes (LEDs). In this embodiment the display element 15 is a row of LEDs, and the number of lightening LEDs stands for a rate of the electric quantity. When a user's finger slides on the touch zone 25, variation of an electric signal generated by the touch sensor element 11 is detected by the touch detection control circuit 12, a remaining electric quantity of the case battery 4 is detected by the battery detection circuit 13, and then the display control circuit 14 reads the information about the electric quantity detected by the battery detection circuit 13 so as to control the LEDs to light for indicating the remaining electric quantity of the case battery 4. The touch detection control circuit 12, the battery detection circuit 13, and the display control circuit 14 are capable of being integrated in one control chip IC or two, or are respectively integrated in an individual control chip, or in the touch PCB 8 which is individually provided, or directly integrated in the cigarette case PCB 5.

In this embodiment, the touch PCB 8 is individually provided, and the touch sensor element 11 comprises multiple conductors arranged on a front side of the touch PCB 8 to form a plurality of touch points, the conductors being electrically separated from each other. The conductors comprise electrodes and resistors. The display element 15 is a row of LEDs disposed on the front side of the touch PCB 8 as well. A control IC 16 is provided on a rear side of the touch PCB 8 for integrating with the touch detection control circuit 12, the battery detection circuit 13, and the display control circuit 14. Alternatively, the battery detection circuit 13 and/or the display control circuit 14 are capable of being integrated in the cigarette case PCB 5. The touch PCB 8 and the cigarette case PCB 5 are electrically connected with each other though a connector 7.

The touch sensor element 11 of the touch control module 10 is disposed on an inner wall of the case body 2 with respect to the touch zone 25. Alternatively, the touch sensor element 11 is disposed within the touch zone 25. In this embodiment, the display area 24 is exemplified by the plurality of openings corresponding to the LEDs 15. A light guiding plate 150 is mounted and exposed to the LEDs 15 so as to effectively reflect the light emitted from the LEDs 15 to outside of the case body 2 and to avoid light leakage from other portions and reduce light loss. A high transmittance protruding cover (not shown) is provided on the light guiding plate 150 corresponding to the LEDs so as to be beneficial to guide light, position and protect the LEDs. A thin film formed on a bottom of the protruding cover is perfectly attached to the front side of the touch PCB 8 and the inner wall of the case body 2 so as to seal the light. The LEDs 15 are exposed outside the case body 2 in a manner such that the LEDs 15 penetrate the protruding cover of the light guiding plate 150 and pass through the openings 24. Certainly, the display area 24 can be a display window made of transparent material, wherein the LEDs are located directly under the display window. As a result, a surface of the case body 2 still remains smooth.

According to another embodiment, the touch zone 25 and the display area 24 are defined on a side wall of the case body 2, the touch PCB 8 is correspondingly disposed the inner wall of the case body 2, and the touch sensor element 11 is disposed on the inner wall of the case body 2 with respect to the touch zone 25. The LEDs 15 are mounted to the protruding cover of the light guiding plate 150 and pass through the respective openings of the display area 24 so as to be extended out of the case body 2 and arranged in a row. The electronic cigarette case of the present invention has a simplified structure and an aesthetic appearance. Because the touch zone 25 is integrally defined on the case body 2 without being provided additionally, and the touch sensor element 11 is disposed in the case body 2, the touch key unit of the electronic cigarette case of the present invention has advantages of durability, waterproof and dust proof, rapidly response, space saving, and easily use.

The touch key unit of the present invention is designed as a resistive touch switch or a capacitive sensor switch; namely, a slide-type key unit or a touch-type key unit. Human bodies are electrically conducting, while circuits on the touch sensor element 11 of the capacitive sensor switch are capable of generating an electrostatic field spread evenly thereon. When a finger moves on the touch zone 25, capacitance on surfaces of conductors of the touch sensor element is changed, whereby the touch detection control circuit 12 is executed according to the change in capacitance to perform the predefined function. A capacitive key unit is very easy to use, inasmuch as whatever types of dielectrics (such as glass, plastic material, stone, ceramics, or wood) are in between the touch sensor element 11 (i.e. an inductive electrode or conductor) and the finger is capable of responding to signals of an individual sensor area, and is therefore high sensitive. The principal of utilizing the resistive touch switch is to touch a finger to two electrically separated conductors so as to control the circuit on or off. For example, provide metal points of A and B as dual contact touch electrodes. The circuit is off when a finger doest not touch the electrodes A and B. While the finger simultaneously touches the electrodes A and B as put an equivalent effect resistance, resistance is changed and therefore the circuit is controlled by variation of the resistance being detected.

Figure 6:
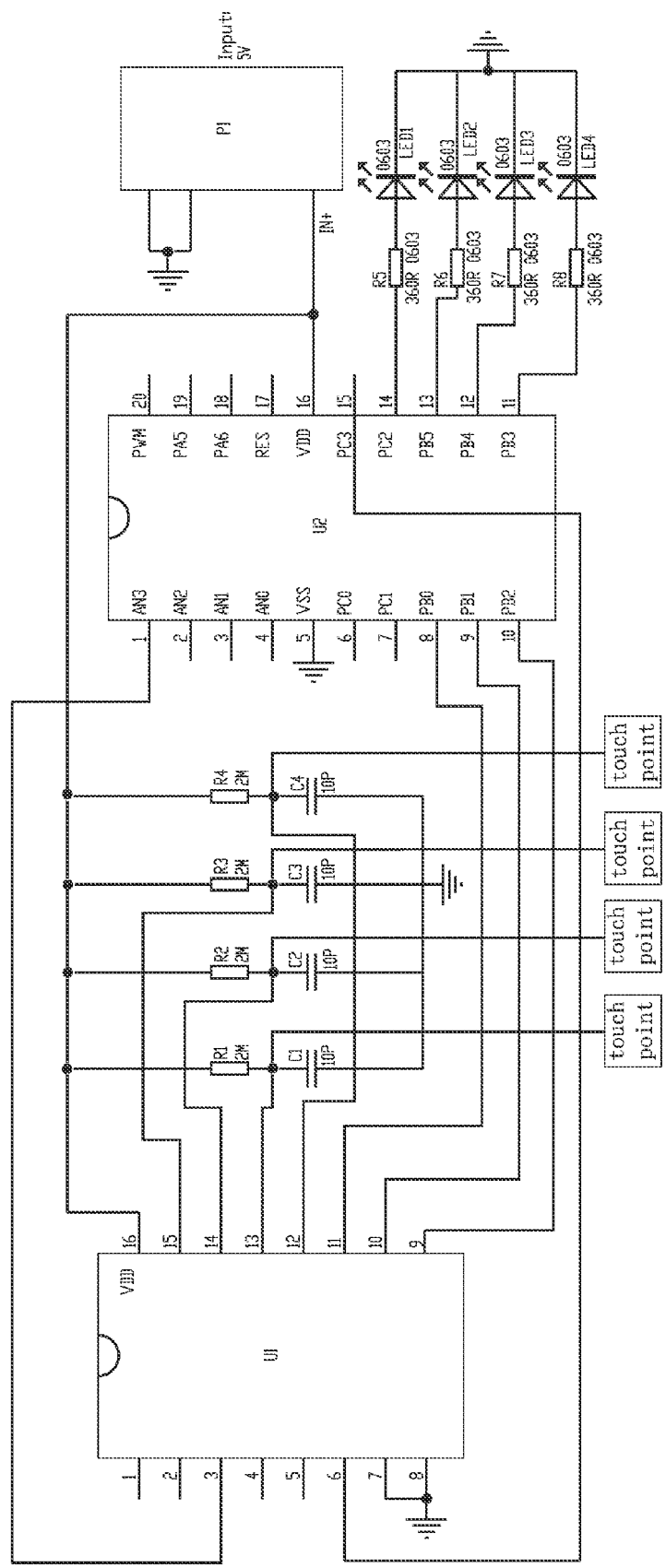
FIG. 6 is a circuit diagram of a touch control in accordance with an embodiment of the present invention.

In a preferable embodiment of the present invention, the touch key unit utilizes the capacitive sensor switch to detect capacitive variation when touching a figure onto the touch sensor conductor through time of charge/discharge over a resistance-capacitance network formed by a resistance and a capacitance CX (X=1, 2, 3 and 4) of an inductive electrode. When a finger touching and moving on the touch zone 25, a coupling capacitance is formed on surfaces of a body electric field and the conductor of the touch sensor element 11. As a result, the finger receives a small amount of current from a touching point, the current flows through the electrodes, and the detection circuit detects the variation so as to excite the display unit to indicate an electric quantity of the battery. Referring to FIG. 6 showing an embodiment of a circuit diagram, the touch detection control circuit 12 consists of a processing unit U1 and an electronic circuit. The touch sensor element 11 comprises a capacitance and an electrode. When a finger touches the touching point, electricity charge or discharge is generated by a corresponding capacitance, and the processing unit U1 detects an electrical signal generated by the capacitance. The LEDs of the display element 15 are controlled by a circuit of another processing unit U2. A battery P1 (the case battery 4 represents a detection circuit (not shown) of the case battery 4, and is integrated in the cigarette case PCB 5 or the touch PCB 8, or integrated in the processing unit U1 or U2, for detecting an electric quantity of the case battery 4 and for transmitting electric quantity signals after detection to the processing unit U1 or U2 so as to excite the LEDs to light in a corresponding number.

Preferably, to avoid unintentional touch by a human body on the touch zone 25, whereby causing the LEDs 15 to light, the touch detection control circuit 12 is defined to be executed when a finger slides over all touch points corresponding to the touch zone 25, as all conductors corresponding to the touch sensor element 11 are all changed in capacitance which are detected by the touch detection control circuit 12 after the slide of the finger, the LEDs 15 are therefore excited to light in a corresponding number in order to indicate a remaining electric quantity of the battery.

It is understood that according to the principal of the resistive touch switch, a touch switch adapted to the present invention is a resistive type or other types that are capable of performing the predefined function by touching a finger onto the touch zone 25 of the case body 2.

Figure 10:
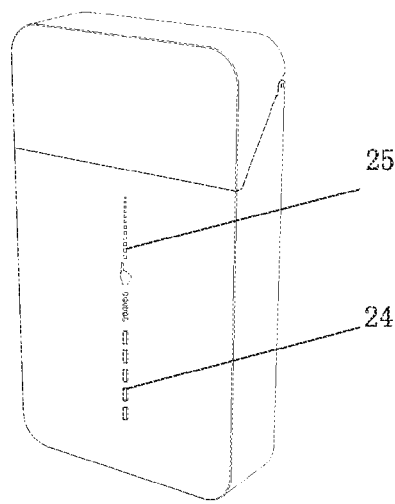
FIG. 10 is a perspective view of an electronic cigarette case in accordance with another embodiment of the present invention.

It is understood that the touch key unit and the display unit of the touch control module 10 are capable of being disposed on any appropriate portions of the electronic cigarette case 100. As shown in FIG. 10, the touch zone 25 and the row of LEDs 15 are disposed on the front side of the case body 2, and the touch sensor element 11 is disposed with respect to and behind the touch zone 25. Alternatively, the touch zone 25 and the row of LEDs 15 are disposed on a bottom side or a top side of the case body 2, or on a same side or different sides of the case body 2.

Figure 11:
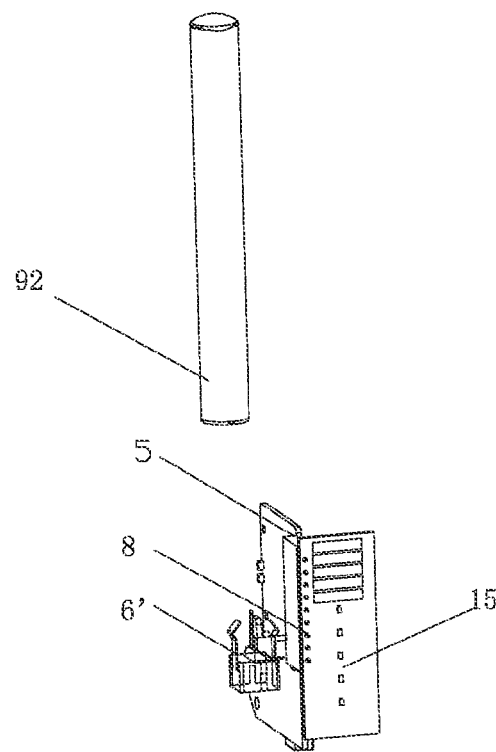
FIG. 11 is a perspective exploded view of the electronic cigarette case in accordance with another embodiment of the present invention.

According to another embodiment as shown in FIG. 11, the battery detection circuit 13 is intended to detect an electric quantity of the battery rod 92 of the electronic cigarette 9 inserted in the electronic cigarette case 100, wherein the battery rod 92 is electrically connected to the PCB 5 by a battery connector 6'. Other structures and principals applied herein are same as the preceding embodiments. Understandably, the case battery 4 is not necessary in this embodiment. The battery rod 92 is charged by the charging port 51.

In other embodiments, when performing other functions in a manner of touch control, the display control circuit 14 is a multimedia play control circuit, and the display element 15 is a multimedia play module. When a finger slides on the touch zone 25, the touch detection control circuit 12 detects that the touch sensor element 11 is changed in capacitance, whereby exciting the multimedia play control circuit to trigger the multimedia module and play music or video.

It is understood that the invention may be embodied in other forms within the scope of the claims. Thus the present examples and embodiments are to be considered in all respects as illustrative, and not restrictive, of the invention defined by the claims.

What is claimed is:

1. An electronic cigarette case, comprising: a case body, a frame module disposed in the case body, a battery module, and a printed circuit board (PCB) module, wherein the case body is defined with a touch zone for a finger moving thereon and a display area for displaying a predefined function; the electronic cigarette case further comprises a touch control module in the case body; the touch control module is defined to detect a finger touching and moving on the touch zone, and accordingly to perform the predefined function;

the touch control module comprises a touch sensor element and a touch detection control circuit electrically coupled to the touch sensor element;

the touch detection control circuit is capable of detecting variation of an electrical signal of the touch sensor element when a finger touches and moves on the touch zone;

the touch sensor element is disposed on an inner wall of the case body with respect to the touch zone, or the touch sensor element is disposed within the touch zone;

the touch sensor element comprises a set of conductors or resistors being electrically separately from each other, the PCB module comprises a touch PCB, the touch control module further comprises a display control circuit and a display element connected with the display control circuit, the display control circuit is operable to control the display element to display information; the touch detection control circuit is capable of exciting the display control circuit to trigger the display element displaying predefined information when variation of the corresponding electrical signal is detected, the display element is disposed within or behind the display area in the case body;

the touch zone is substantially a portion of an outer surface of the case body, and is provided with a mark for the purpose of recognition by users, the display area is at least an opening, a transparent display window, or a liquid crystal display (LCD) screen, the display element is a row of light emitting diodes (LEDs), a LCD, or a multimedia play module;

the touch zone and the display area are defined on a side wall of the case body, the touch PCB is correspondingly disposed on an inner wall of the case body, the touch sensor element and the display element are respectively located corresponding to the touch zone and the display area, the frame module comprises a tray, a cartridge holder and a bottom base, the tray and the cartridge holder cooperatively hold cartridges of electronic cigarettes therein, and the battery module and the PCB module are securely disposed in the bottom base.

2. The electronic cigarette case of claim 1, wherein the touch detection control circuit is used to detect all electrodes or the resistors changed correspondingly in capacitance or resistance and to excite the display control circuit to trigger the display element displaying predefined information.

3. The electronic cigarette case of claim 1, wherein the at least a predefined function is to indicate a remaining electric quantity of the battery module, the touch control module further comprises a battery detection circuit for detecting the electric quantity of the battery module, the display element is capable of displaying the remaining electric quantity; and when a finger moves on the touch zone, the touch detection control circuit is capable of detecting variation of the corresponding electrical signal and exciting the display control circuit to control the display element to display an electric quantity of the battery module detected by the battery detection circuit.

4. The electronic cigarette case of claim 3, wherein the touch detection control circuit is integrated with the touch PCB, the display control circuit is integrated with the touch PCB, and the battery detection circuit is integrated with the touch PCB.

5. The electronic cigarette case of claim 1, wherein the touch sensor element is installed with the touch PCB, the display element is installed with the touch PCB, the battery module is a case battery and/or an electronic cigarette battery, the battery module is electrically connected with the PCB module through a battery connector, and the PCB module is provided with a charging port for charging the battery module from an external power.

6. The electronic cigarette case of claim 1, wherein the PCB module further comprises a cigarette case PCB; the cigarette case PCB and the touch PCB both connected through a connector.

7. The electronic cigarette case of claim 1, wherein the touch sensor element and the display element are installed on a front side of the touch PCB, the touch detection control circuit is integrated in a control integrated circuit (IC) of the touch PCB, the control IC is installed on a rear side of the touch PCB, and the display control circuit is integrated in the control IC.

8. The electronic cigarette case of claim 1, wherein the display element is a row of light emitting diodes (LEDs); the LEDs are capable of indicating a rate of the remaining electric quantity; and the LEDs are excited to light a corresponding number to the remaining electric quantity.

9. The electronic cigarette case of claim 8, further comprising a light guiding plate mounted above the LEDs, and the LEDs are disposed within or behind the display area over the light guiding plate.

10. The electronic cigarette case of claim 1, wherein the touch control module further comprises a predefined function unit comprising a control function starter circuit and a predefined function module, and when variation of an electrical signal is detected by the touch detection control circuit, the touch detection control circuit excites the control function starter circuit to trigger the predefined function module so as to perform the at least a predefined function.

11. The electronic cigarette case of claim 1, wherein the predefined function comprises music play, video play, temperature display, or turning a radio on and off; and a music module, a video module, a temperature module, or a radio module is accordingly further provided in the electronic cigarette case and are controlled by the touch control module.

12. The electronic cigarette case of claim 9, wherein the set of conductors of the touch sensor element are arranged on a front side of the touch PCB to form a plurality of touch points; the row of LEDs are disposed on the front side of the touch PCB; the display area is a plurality of openings corresponding to the LEDs, or the display area is a display window made of transparent material and the LEDs are located under the display window whereby a surface of the case body still remains smooth.

13. The electronic cigarette case of claim 12, wherein a protruding cover with high transmittance is provided on the light guiding plate corresponding to the LEDs to guide light, position and protect the LEDs; the LEDs are mounted to the protruding cover of the light guiding plate and pass through the respective openings of the display area whereby to extend out of the case body and be arranged in a row.

14. The electronic cigarette case of claim 8, wherein the touch detection control circuit is defined to be executed when a finger slides over all the set of conductors or resistors of the touch sensor element; as all conductors or resistors corresponding to the touch sensor element are all changed in capacitance and are detected by the touch detection control circuit, the LEDs are therefore excited to light in a corresponding number in order to indicate a remaining electric quantity of the battery.

* * * * *